(12) United States Patent
Chiang et al.

(10) Patent No.: US 7,626,201 B2
(45) Date of Patent: *Dec. 1, 2009

(54) SEMICONDUCTOR DEVICE

(75) Inventors: Hai Q. Chiang, Corvallis, OR (US);
Randy L. Hoffman, Corvallis, OR (US);
David Hong, Eugene, OR (US); Nicole L. Dehuff, Philomath, OR (US); John F. Wager, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 3 days.

This patent is subject to a terminal disclaimer.

(21) Appl. No.: 11/543,548

(22) Filed: Oct. 4, 2006

(65) Prior Publication Data

US 2007/0023750 A1 Feb. 1, 2007

Related U.S. Application Data

(63) Continuation of application No. 10/799,471, filed on Mar. 12, 2004, now Pat. No. 7,145,174.

(51) Int. Cl.
*H01L 29/04* (2006.01)
*H01L 29/15* (2006.01)

(52) U.S. Cl. .................... 257/59; 257/72; 257/E29.145; 257/E29.273

(58) Field of Classification Search .................. 257/72, 257/59, E29.145, E29.273; 438/48, 128, 438/149, 151, 157, 283
See application file for complete search history.

(56) References Cited

U.S. PATENT DOCUMENTS

| 6,727,522 | B1 * | 4/2004 | Kawasaki et al. ........... 257/103 |
| 7,145,174 | B2 * | 12/2006 | Chiang et al. ................. 257/59 |
| 2007/0194379 | A1 | 8/2007 | Hosono et al. |

* cited by examiner

*Primary Examiner*—Kenneth A Parker
*Assistant Examiner*—Joseph Nguyen

(57) ABSTRACT

A semiconductor device can include a channel including a zinc-indium oxide film.

20 Claims, 6 Drawing Sheets

SEMICONDUCTOR DEVICE

CROSS-REFERENCE TO RELATED APPLICATION

This application is a continuation of U.S. application Ser. No. 10/799,471, filed Mar. 12, 2004, now U.S. Pat. No. 7,154,174 the specification of which is incorporated herein by reference.

INTRODUCTION

Semiconductor devices are used in a variety of electronic devices. For example, thin-film transistor technology can be used in liquid crystal display (LCD) screens. Some types of thin-film transistors have relatively slow switching speeds because of low carrier mobility. In some applications, such as LCD screens, use of thin-film transistors with relatively slow switching speeds can make it difficult to accurately render motion.

DETAILED DESCRIPTION

The exemplary embodiments of the present disclosure include semiconductor devices, such as transistors, that contain both zinc and indium. Additionally, exemplary embodiments of the disclosure account for the properties possessed by semiconductor device that contain both zinc and indium, e.g. optical transparency, and electrical performance. Exemplary embodiments include semiconductor device that contain a zinc-indium oxide channel. In some of the exemplary embodiments, the zinc-indium oxide can include an amorphous form, a single-phase crystalline state, or a mixed-phase crystalline state.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It should be understood that the various semiconductor devices may be employed in connection with the various embodiments of the present disclosure, i.e., field effect transistors including thin-film transistors, active matrix displays, logic inverters, and amplifiers. FIGS. 1A-1F illustrate exemplary thin-film transistor embodiments. The thin-film transistors can be of any type, including but not limited to, horizontal, vertical, coplanar electrode, staggered electrode, top-gate, bottom-gate, single-gate, and double-gate, to name a few.

As used herein, a coplanar electrode configuration is intended to mean a transistor structure where the source and drain electrodes are positioned on the same side of the channel as the gate electrode. A staggered electrode configuration is intended to mean a transistor structure where the source and drain electrodes are positioned on the opposite side of the channel as the gate electrode.

Figure 1A:
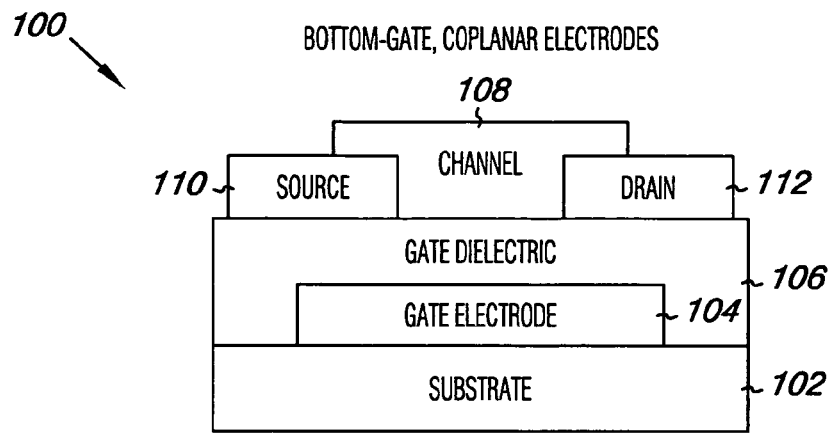
FIGS. 1A-1F illustrate various embodiments of a semiconductor device, such as a thin-film transistor.
Figure 1B:
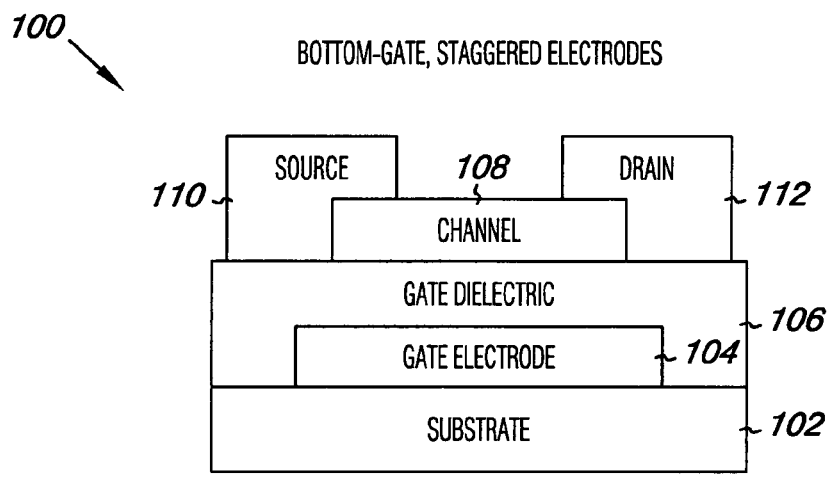
Figure 1C:
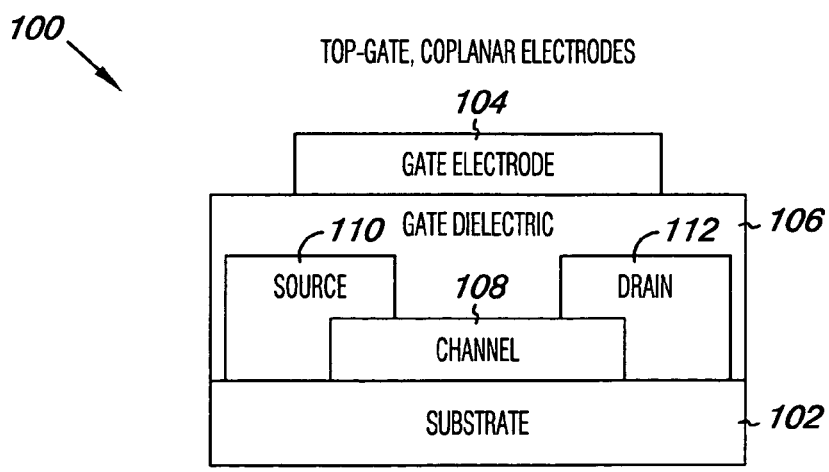
Figure 1D:
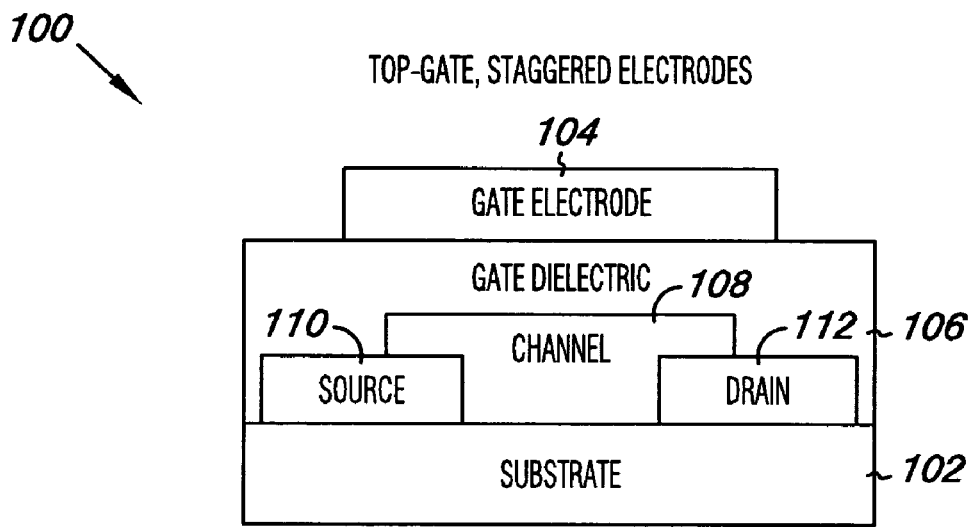
Figure 1E:
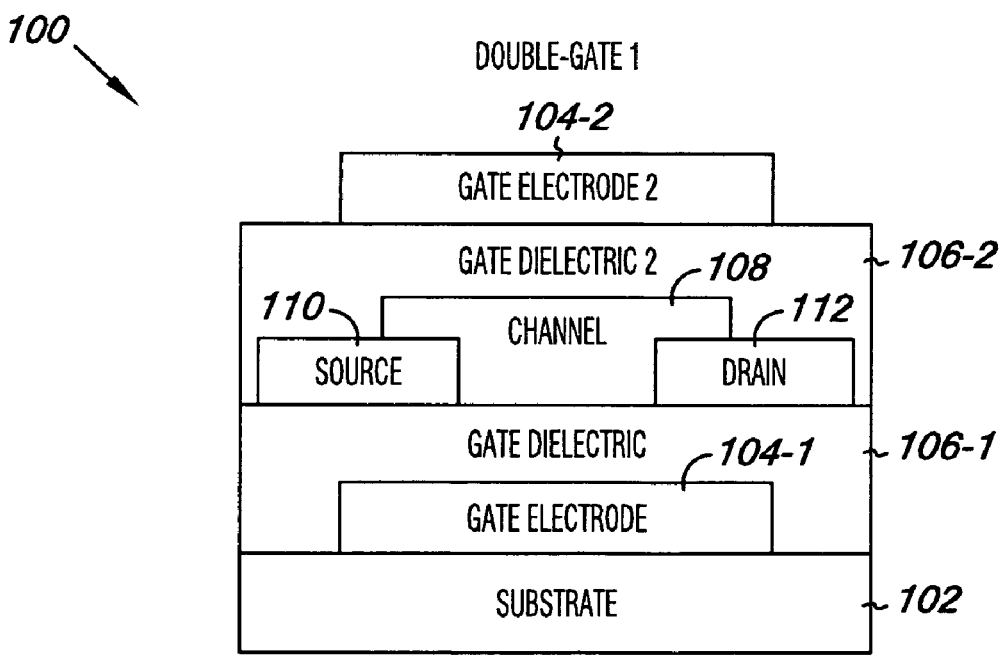
Figure 1F:
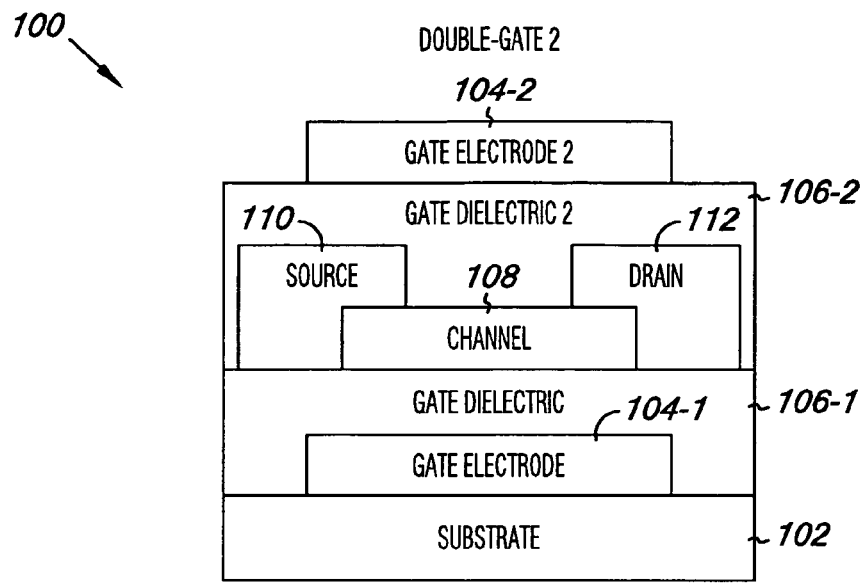

FIGS. 1A and 1B illustrate embodiments of bottom-gate transistors, FIGS. 1C and 1D illustrate embodiments of top-gate transistors, and FIGS. 1E and 1F illustrate embodiments of double-gate transistors. In each of FIGS. 1A-1D, the transistors 100 include a substrate 102, a gate electrode 104, a gate dielectric 106, a channel 108, a source electrode 110, and a drain electrode 112. In each of FIGS. 1A-1D, the gate dielectric 106 is positioned between the gate electrode 104 and the source and drain electrodes 110, 112 such that the gate dielectric 106 physically separates the gate electrode 104 from the source and the drain electrodes 110, 112. Additionally, in each of the FIGS. 1A-1D, the source and the drain electrodes 110, 112 are separately positioned thereby forming a region between the source and drain electrodes 110, 112 for interposing the channel 108. Thus, in each of FIGS. 1A-1D, the gate dielectric 106 is positioned adjacent the channel 108, and physically separates the source and drain electrodes 110, 112 from the gate electrode 104. Additionally, in each of the FIGS. 1A-1D, the channel 108 is positioned adjacent the gate dielectric 106 and is interposed between the source and drain electrodes 110, 112.

In various embodiments, such as in the double-gate embodiments shown in FIGS. 1E and 1F, two gate electrodes 104-1, 104-2 and two gate dielectrics 106-1, 106-2 are illustrated. In such embodiments, the positioning of the gate dielectrics 106-1, 106-2 relative to the channel 108 and the source and drain electrodes 110, 112, and the positioning of the gate electrodes 104-1, 104-2 relative to the gate dielectrics 106-1, 106-2 follow the same positioning convention described above where one gate dielectric and one gate electrode are illustrated. That is, the gate dielectrics 106-1, 106-2 are positioned between the gate electrodes 104-1, 104-2 and the source and drain electrodes 110, 112 such that the gate dielectrics 106-1, 106-2 physically separate the gate electrodes 104-1, 104-2 from the source and the drain electrodes 110, 112.

In each of FIGS. 1A-1F, the channel 108 interposed between the source and the drain electrodes 110, 112 provide a controllable electric pathway between the source and drain electrodes 110, 112 such that when a voltage is applied to the gate electrode 104, an electrical charge can move between the source and drain electrodes 110, 112 via the channel 108. The voltage applied at the gate electrode 104 can vary the ability of the channel 108 to conduct the electrical charge and thus, the electrical properties of the channel 108 can be controlled, at least in part, through the application of a voltage at the gate electrode 104.

Figure 2A:
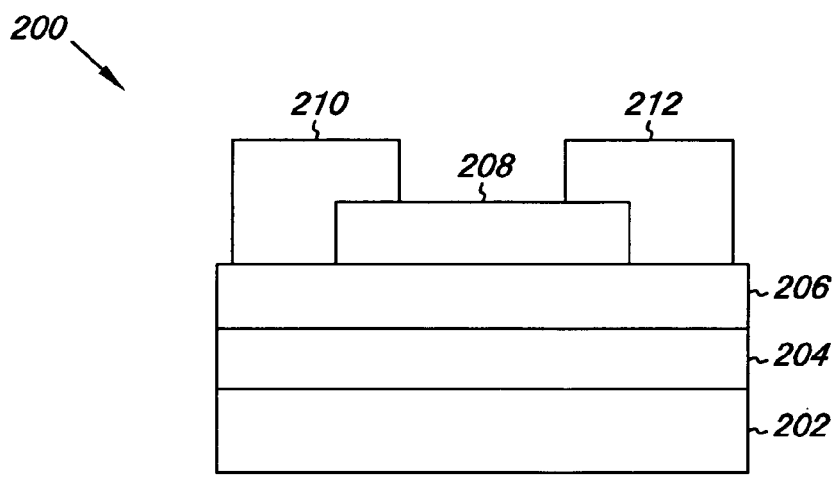
FIGS. 2A-2B illustrate a cross-sectional schematic of an embodiment of a thin-film transistor.
Figure 2B:
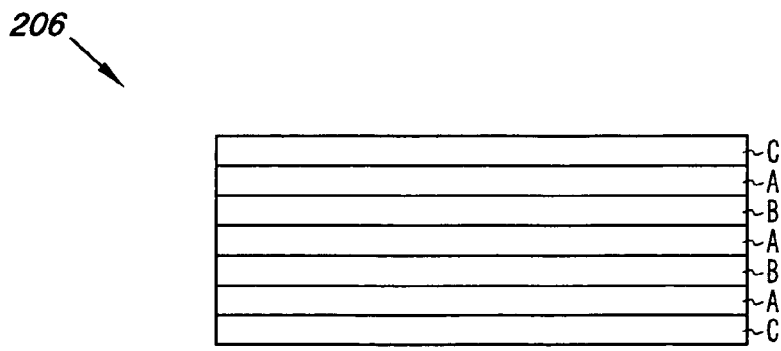

A more detailed description of an embodiment of a thin-film transistor is illustrated in FIGS. 2A and 2B. FIG. 2A illustrates a cross-sectional view of an exemplary bottom gate thin-film transistor 200 and FIG. 2B illustrates a cross-sectional view of an exemplary gate dielectric 206 of the thin-film transistor 200. It will be appreciated that the different layers of the thin-film transistor described in FIGS. 2A and 2B, the materials in which they constitute, and the methods in which they are formed can be equally applicable to any of the transistor embodiments described herein, including those described in connection with FIGS. 1A-1F.

Moreover, in the various embodiments, the thin-film transistor 200 can be included in a number of devices including an active matrix display screen device, a logic inverter, and an amplifier. The thin-film transistor 200 can also be included in an infrared device, where transparent components are also used.

As shown in FIG. 2A, the thin-film transistor 200 can include a substrate 202, a gate electrode 204 positioned adjacent the substrate 202, a gate dielectric 206 positioned adjacent the gate electrode 204, and a channel 208 contacting the gate dielectric 206, a source electrode 210, and a drain electrode 212. In the various embodiments, the channel 208 can be positioned between and electrically couple the source electrode 210 and the drain electrode 212.

In the embodiment shown in FIG. 2A, the substrate 202 includes glass. However, substrate 202 can include any suitable substrate material or composition for implementing the various embodiments, as will be more fully discussed in connection with FIG. 3.

The substrate 202 illustrated in FIG. 2 includes a blanket coating of ITO, i.e., indium-tin oxide to form the gate electrode 204. However, any number of materials can be used for the gate electrode 204. Such materials can include transparent materials such as an n-type doped $In_2O_3$, $SnO_2$, or ZnO, and the like. Other suitable materials include metals such as In, Sn, Ga, Zn, Al, Ti, Ag, Cu, and the like. In the embodiment illustrated in FIG. 2A, the thickness of the gate electrode 204 is approximately 200 nm. The thickness of a gate electrode can vary depending on the materials used, device type, and other factors.

The gate dielectric 206 shown in FIG. 2A is also blanket coated. Although the gate electrode 204 and gate dielectric 206 are shown as blanket coated, unpatterned layers in FIG. 2A, they can be patterned. In the various embodiments, the gate dielectric 206 can include various layers of different materials having insulating properties representative of gate dielectrics. Such materials can include tantalum pentoxide ($Ta_2O_5$), Strontium Titanate (ST), Barium Strontium Titanate (BST), Lead Zirconium Titanate (PZT), Strontium Bismuth Tantalate (SBT) and Bismuth Zirconium Titanate (BZT), silicon dioxide ($SiO_2$), silicon nitride ($Si_3N_4$), magnesium oxide (MgO), aluminum oxide ($Al_2O_3$), hafnium(IV)oxide ($HfO_2$), zirconium(IV)oxide ($ZrO_2$), various organic dielectric materials, and the like.

In the embodiment shown in FIG. 2B, the gate dielectric 206 includes a number of alternating layers of differing materials having the formula $AlO_x$ and $TiO_y$, where $AlO_x$ includes aluminum-oxide and $TiO_y$ includes titanium oxide. In this embodiment, the interior layers are illustrated as type A and type B, and the outer layers are illustrated as type C layers where the type A layers include $AlO_x$, the type B layers include $TiO_y$, and the type C layers include $Al_2O_3$ or other suitable materials. Thus, in the embodiment illustrated in FIG. 2B, the gate dielectric 206 includes three type A layers, two type B layers, and two type C layers, which form the outer layers. The material used in the type C layers illustrated in FIG. 2B includes $Al_2O_3$, but any other suitable material can be used.

In various embodiments, the gate dielectric 206 may be deposited by a low-pressure CVD process using $Ta(OC_2H_5)_5$ and $O_2$ at about 430° C., and may be subsequently annealed in order to reduce leakage current characteristics. Other methods for introducing the gate dielectric can include various CVD and sputtering techniques and atomic layer deposition, evaporation, and the like as will be described in more detail herein.

In the various embodiments, the source electrode 210 and the drain electrode 212 are separately positioned adjacent the gate dielectric 206. In the embodiment shown in FIG. 2A, the source and drain electrodes 210, 212 can be formed from the same materials as those discussed in regards to the gate electrode 204. In FIG. 2A, the source and drain electrodes 210, 212 have a thickness of approximately 200 nm. However, the thickness can vary depending on composition of material used, application in which the material will be used, and other factors. The choice of source and drain electrode material can vary depending on the application, device, system, etc., in which they will be used. Overall device performance is likely to vary depending on the source and drain materials. For example, in devices where a substantially transparent thin-film transistor is desired, the materials for the source, drain, and gate electrodes can be chosen for that effect.

In the various embodiments, the channel 208 can be formed from a ternary material containing zinc, indium and oxygen to form zinc-indium oxide (e.g., $Zn_xIn_{2y}O_{x+3y}$). In the various embodiments, these materials can include various morphologies depending on composition, processing conditions, and other factors. The various morphological states can include amorphous states, and polycrystalline states. A polycrystalline state can include a single-phase crystalline state or a mixed-phase crystalline state. The various morphologies of the materials forming the channel 208 will be more fully discussed below in connection with FIG. 3. Additionally, in the various embodiments, the source, drain, and gate electrodes can include a substantially transparent material. By using substantially transparent materials for the source, drain, and gate electrodes, areas of the thin-film transistor can be transparent to the portion of the electromagnetic spectrum that is visible to the human eye. In the transistor arts, a person of ordinary skill will appreciate that devices such as active matrix liquid crystal displays having display elements (pixels) coupled to thin-film transistors (TFT's) having substantially transparent materials for selecting or addressing the pixel to be on or off may benefit display performance by allowing more light to be transmitted through the display.

Referring back to FIG. 2A, the channel 208 is formed of a zinc-indium oxide with a thickness of about 50 nm, however, in various embodiments the thickness can vary depending on a variety of factors including whether the channel material is amorphous or polycrystalline, and the device in which the channel is to be incorporated.

In this embodiment, the channel 208 is positioned adjacent the gate dielectric 206 and between the source and drain electrodes 210, 212, so as to contact and electrically couple the electrodes 210 and 212. An applied voltage at the gate electrode 204 can facilitate electron accumulation in the channel 208. In addition, the applied voltage can enhance electron injection from the source electrode 210 to the channel 208 and electron extraction therefrom by the drain electrode 212. In the embodiments of the present disclosure, the channel 208 can allow for on/off operation by controlling current flowing between the drain electrode 212 and the source electrode 210 using a voltage applied to the gate electrode 204.

Herein, "zinc-indium oxide" can include the form of a zinc- and indium-containing film. The zinc-indium oxide, as described herein, shows very satisfactory electrical performance, specifically in the area of channel mobility. The zinc-indium oxide has been shown to exhibit surprising increased electron mobility as high as ~30 $cm^2/Vs$. As appreciated by one skilled in the art, mobility is a characteristic that can help in determining thin-film transistor performance, as maximum operating frequency, speed, and drive current increase in direct proportion to channel mobility. In addition, the zinc-indium oxide can be transparent in both the visible and infra-red spectrums, allowing for an entire thin-film transistor to be optically transparent throughout the visible region of the electromagnetic spectrum.

The use of the zinc-indium oxide illustrated in the embodiments of the present disclosure is beneficial for a wide variety of thin-film applications in integrated circuit structures. For example, such applications include transistors, as discussed herein, such as thin-film transistors, horizontal, vertical, coplanar electrode, staggered electrode, top-gate, bottom-gate, single-gate, and double-gate, to name only a few. In the various embodiments, transistors (e.g., thin-film-transistors) of the present disclosure can be provided as switches or amplifiers, where applied voltages to the gate electrodes of the transistors can affect a flow of electrons through the zinc-indium oxide of the channel. As one of ordinary skill will appreciate, when the transistor is used as a switch, the transistor can operate in the saturation region, and where the transistor is used as an amplifier, the transistor can operate in the linear region. In addition, the use of transistors incorporating a channel of zinc-indium oxide in integrated circuits and structures incorporating integrated circuits such as visual display panels (e.g., active matrix LCD displays) such as that shown and described in connection with FIG. 5 below. In display applications and other applications, since zinc-indium oxide is itself optically transparent, it may often be desirable to fabricate one or more of the remaining thin-film transistor layers, e.g., source, drain, and gate electrodes, to be at least partially transparent.

In FIG. 2A, the source electrode 210 and the drain electrode 212 include an ITO layer having a thickness of about 200 nm. In the various embodiments however, the thickness can vary depending on a variety of factors including type of materials, applications, and other factors. In various embodiments, the electrodes 210, 212, may include a transparent conductor, such as an n-type doped wide-bandgap semiconductor. Examples include, but are not limited to, n-type doped $In_2O_3$, $SnO_2$, indium-tin oxide (ITO), or ZnO, and the like. The electrodes 210, 212 may also include a metal such as In, Sn, Ga, Zn, Al, Ti, Ag, Cu, Au, Pt, W, or Ni, and the like. In the various embodiments of the present disclosure, all of the electrodes 204, 210, and 212 may include transparent materials such that the various embodiments of the transistors may be made substantially transparent.

The various layers of the transistor structures described herein can be formed using a variety of techniques. For example, the gate dielectric 206 may be deposited by a low-pressure CVD process using $Ta(OC_2H_5)_5$ and $O_2$ at about 430° C., and may be subsequently annealed in order to reduce leakage current characteristics. Thin-film deposition techniques such as evaporation (e.g., thermal, e-beam), physical vapor deposition (PVD) (e.g., dc reactive sputtering, rf magnetron sputtering, ion beam sputtering), chemical vapor deposition (CVD), atomic layer deposition (ALD), pulsed laser deposition (PLD), molecular beam epitaxy (MBE), and the like may be employed. Additionally, alternate methods may also be employed for depositing the various transistor layers of the embodiments of the present disclosure. Such alternate methods can include anodization (electrochemical oxidation) of metal film, as well as deposition from a liquid precursor such as spin coating and ink-jet printing including thermal and piezoelectric drop-on-demand printing. Film patterning may employ photolithography combined with etching or lift-off processes, or may use alternate techniques such as shadow masking. Doping of one or more of the layers (e.g., the channel illustrated in FIG. 2A) may also be accomplished by the introduction of oxygen vacancies and/or substitution of aliovalent elements such as Sn, Al, Ge, and Ga.

Embodiments of the present disclosure also include methods of forming metal containing films on a surface of a substrate or substrate assembly, such as a silicon wafer, with or without layers or structures formed thereon, used in forming integrated circuits, and in particular thin-film transistors as described herein. It is to be understood that methods of the present disclosure are not limited to deposition on silicon wafers; rather, other types of wafers (e.g., gallium arsenide, glass, etc.) can be used as well.

Furthermore, other substrates can also be used in methods of the present disclosure. These include, for example, fibers, wires, etc. In general, the films can be formed directly on the lowest surface of the substrate, or they can be formed on any of a variety of the layers (i.e., surfaces) as in a patterned wafer, for example.

Figure 3:
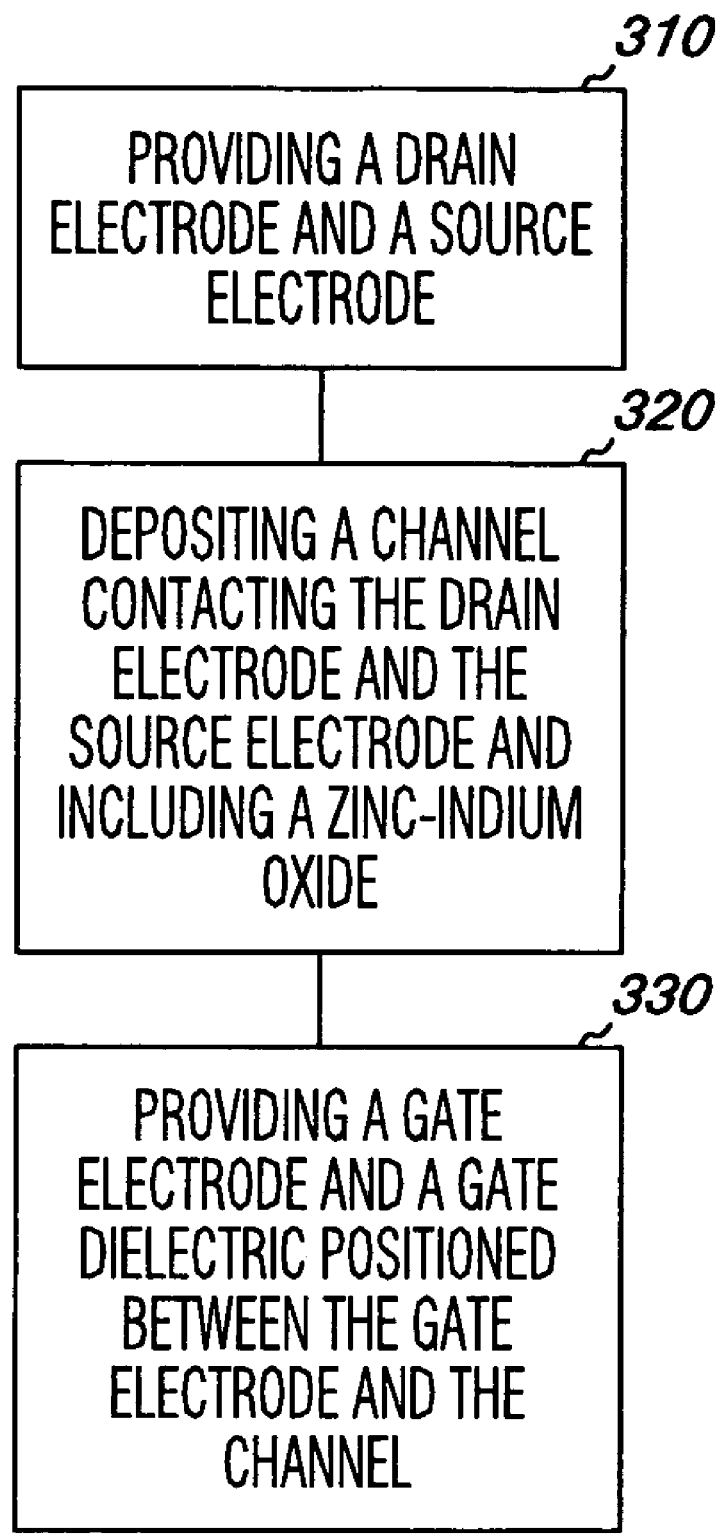
FIG. 3 illustrates a method embodiment for manufacturing an embodiment of a thin-film transistor.

In one embodiment, a method for fabricating a semiconductor structure is illustrated in FIG. 3. In the various embodiments of the disclosure, a substrate or substrate assembly can be provided in forming the semiconductor structure. As used herein, the term "substrate" refers to the base substrate material layer, e.g., the lowest layer of glass material in a glass wafer. The term "substrate assembly" refers to the substrate having one or more layers or structures formed thereon. Examples of substrate types include, but are not limited to, glass, plastic, and metal, and include such physical forms as sheets, films, and coatings, among others, and may be opaque or substantially transparent.

In block 310, a drain electrode and a source electrode can both be provided. For example, both the drain electrode and the source electrode can be provided on the substrate of substrate assembly.

In block 320, a channel contacting the drain electrode and the source electrode, and including a zinc-indium oxide, can be deposited. For example, the channel can be deposited between the drain electrode and a source electrode so as to electrically couple the two electrodes. In the various embodiments, depositing the channel contacting the drain electrode and the source electrode can include providing a precursor composition including one or more precursor compounds including zinc and indium. Various combinations of the precursor compounds described herein can be used in the precursor composition. Thus, as used herein, a "precursor composition" refers to a solid or liquid that includes one or more precursor compounds of the formulas described herein optionally mixed with one or more compounds of formulas other than those described herein. For example, zinc precursor compounds and indium precursor compounds can be provided in one precursor composition or in separate compositions. Alternatively, one precursor compound could be envisioned to provide both metals. As used herein, "liquid" refers to a solution or a neat liquid (a liquid at room temperature or a solid at room temperature that melts at an elevated temperature). As used herein, a "solution" does not call for complete solubility of the solid; rather, the solution may have some undissolved material, more desirably, however, there is a sufficient amount of the material that can be carried by the organic solvent into the vapor phase for chemical vapor deposition processing. The zinc and/or indium precursor compounds can also include one or more organic solvents suitable for use in a chemical vapor deposition system, as well as other additives, such as free ligands, that assist in the vaporization of the desired compounds.

A wide variety of zinc and indium precursor compounds suitable for thin-film deposition techniques can be used with the embodiments of the present disclosure. Although specific compounds are illustrated herein, a wide variety of precursor compounds can be used as long as they can be used in a deposition process. In the various embodiments of the present disclosure, the zinc and indium precursor compounds can include neutral compounds and may be liquids or solids at room temperature. If they are solids, they are sufficiently soluble in an organic solvent to allow for vaporization, they can be vaporized or sublimed, or ablated (e.g., by laser ablation or sputtering) from the solid state, or they have melting temperatures below their decomposition temperatures. Thus, many of the precursor compounds described herein are suitable for use in vapor deposition techniques, such as chemical vapor deposition (CVD) techniques, (e.g., flash vaporization techniques, bubbler techniques, and/or microdroplet techniques).

The precursor compounds described herein can be used in precursor compositions for ink-jet deposition, sputtering, and vapor deposition techniques (e.g., chemical vapor deposition (CVD) or atomic layer deposition (ALD)). Alternatively, certain compounds described herein can be used in other deposition techniques, such as spin-on coating, and the like. Typically, those compounds containing organic R groups with a low number of carbon atoms (e.g., 1-4 carbon atoms per R group) are suitable for use with vapor deposition techniques. Those compounds containing organic R groups with a higher number of carbon atoms (e.g., 5-12 carbon atoms per R group) are generally suitable for spin-on or dip coating.

As used herein, the term "organic R groups" means a hydrocarbon group (with optional elements other than carbon and hydrogen, such as oxygen, nitrogen, sulfur, and silicon) that is classified as an aliphatic group, cyclic group, or combination of aliphatic and cyclic groups (e.g., alkaryl and aralkyl groups). In the context of the present disclosure, the organic groups are those that do not interfere with the formation of a metal-containing film. They may be of a type and size that do not interfere with the formation of a metal-containing film using chemical vapor deposition techniques. The term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

Still referring to FIG. 3, the channel including zinc-indium oxide from the precursor composition can be deposited on a surface of the substrate or substrate assembly. For example, the channel of zinc-indium oxide from the precursor composition can be deposited from the precursor composition between the drain electrode and the source electrode of a thin-film transistor, thereby contacting the drain and source electrodes. In various embodiments, the channel can employ a physical vapor deposition technique such as sputter coating, which can include vaporizing the precursor composition and directing it toward the substrate or substrate assembly. Other methods for depositing the channel can include one or more physical vapor deposition techniques such as dc reactive sputtering, rf sputtering, magnetron sputtering, ion beam sputtering, or combinations thereof.

In the various embodiments, the zinc-indium oxide included in the channel can have a uniform composition throughout its thickness, although this is not a requisite. For example, the zinc precursor compound could be deposited first and then a combination of zinc and indium precursor compounds could be deposited with increasing amounts of zinc precursor compound as the film is formed. As will be appreciated, the thickness of the zinc-indium oxide will be dependent upon the application for which it is used. For example, the thickness can have a range of about 1 nanometer to about 1,000 nanometers. In an alternative embodiment, the thickness can have a range of about 10 nanometers to about 200 nanometers. For example, the thickness range of about 10 nanometers to about 200 nanometers is applicable to a zinc-indium oxide forming the channel 108 of the thin-film transistor 100.

In the embodiments of the present disclosure, the precursor compounds can include one or more zinc precursor compounds and one or more indium precursor compounds. The zinc precursor compounds are typically mononuclear (i.e., monomers in that they contain one metal per molecule) of the formula ZnO, although weakly bound dimers (i.e., dimers containing two monomers weakly bonded together through hydrogen or dative bonds) are also possible. The indium precursor compound can include an indium binary compound $In_2O_3$. In additional embodiments of the present disclosure, the zinc precursor and the indium precursor compounds can include organometallic compounds suitable for vapor deposition. Example of such organometallic compounds include, but are not limited to, zinc acetylacetonate $[Zn(C_5H_7O_2)_2]$ and indium acetylacetonate $[In(C_5H_7O_2)_3]$.

As discussed herein, the precursor compounds for the zinc-indium oxide for use in a sputtering process in the embodiments of the present disclosure can include ZnO and $In_2O_3$. When the channel is deposited in a thin-film by sputtering by use of the above-mentioned target, there can be obtained a single-phase crystalline state for the channel. In the various embodiments, the single-phase crystalline state can include compounds of the formula:

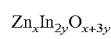

$$Zn_xIn_{2y}O_{x+3y}$$

where the values of x and y can be found in given ranges. For example, x and y can each independently be found in a range of about 1 to about 15, a range of about 2 to about 10, integer values greater than 1, and integer values less than 15. Specific examples of the value of x and y include 2 and 1, respectively, where the single-phase crystalline state of the zinc-indium oxide includes $Zn_2In_2O_5$.

Alternatively, embodiments of the zinc-indium oxide can exhibit a mixed-phase crystalline state resulting from sputtering by use of the above-mentioned target. For example, the mixed-phase crystalline state can include, but is not limited to, two or more phases that can include, for example, ZnO, $Zn_2In_2O_5$, and $In_2O_3$ with a range of phase-to-phase ratio A:B:C (e.g., ZnO:$Zn_2In_2O_5$: $In_2O_3$), where A, B, and C, are each in the range of about 0.01 to about 0.99.

In additional embodiments, the zinc-indium oxide can have a substantially amorphous form. For example, the zinc-indium oxide can include an atomic composition of zinc(x):indium(1-x), where x is in the range of about 0.01 to about 0.99. This atomic composition does not take into consideration the optional presence of oxygen and other elements. It is merely a representation of the relative ratio of zinc and indium. In an additional embodiment, x can be in the range of about 0.1 to about 0.9, and in the range of about 0.05 to about 0.95.

In block 330, both a gate electrode and a gate dielectric positioned between the gate electrode and the channel can be provided in forming an embodiment of the thin-film transistor of the present disclosure.

The following example is offered to further illustrate the techniques in which the various layers of the transistor may be deposited including the channel described in FIG. 3, specifically so as to obtain the electrical characteristics depicted in FIG. 4. It should be understood, however, that many variations and modifications may be made while remaining within the scope of the present disclosure.

A substrate of aluminosilicate glass is coated with indium-tin oxide (ITO, $In_2O_3$:Sn) and aluminum-titanium oxide (ATO), acting as the gate electrode and gate dielectric, respectively. Zinc-indium oxide (TFT channel) is deposited onto the ATO gate dielectric via RF sputtering at 2.5 W/cm² from a ceramic target with stoichiometry $(ZnO)_2(In_2O_3)_1$. Zinc-indium oxide sputtering is carried out at 5 mTorr of $Ar/O_2$ (90/10%); the substrate is unheated during deposition. ITO source and drain electrodes are deposited onto the zinc-indium oxide channel. Prior to deposition of the source and drain electrodes, the stack is annealed in air at 600° C. for 1 hour. The resulting TFT structure shows a channel mobility as high as 30 cm²/V s.

Sputtering or chemical vapor deposition processes can be carried out in an atmosphere of inert gas and/or a reaction gas to form a relatively pure zinc-indium oxide. The inert gas is typically selected from the group including nitrogen, helium, argon, and mixtures thereof. In the context of the present disclosure, the inert gas is one that is generally unreactive with the precursor compounds described herein and does not interfere with the formation of a zinc-indium oxide.

The reaction gas can be selected from a wide variety of gases reactive with the compound described herein, at least at a surface under the conditions of deposition. Examples of reaction gases include hydrogen and oxidizing gases such as $O_2$. Various combinations of carrier gases and/or reaction gases can be used in the embodiments of the present disclosure to form zinc-indium oxide.

For example, in a sputtering process for the zinc-indium oxide, the process may be performed by using a mixture of argon and oxygen as the sputtering gas at a particular flow rate, with the application of an RF power for achieving the desired deposition in a sputter deposition chamber. However, it should be readily apparent that any manner of forming the zinc-indium oxide is contemplated in accordance with the present disclosure and is in no manner limited to any particular process, e.g., sputtering, for formation thereof.

Figure 4A:
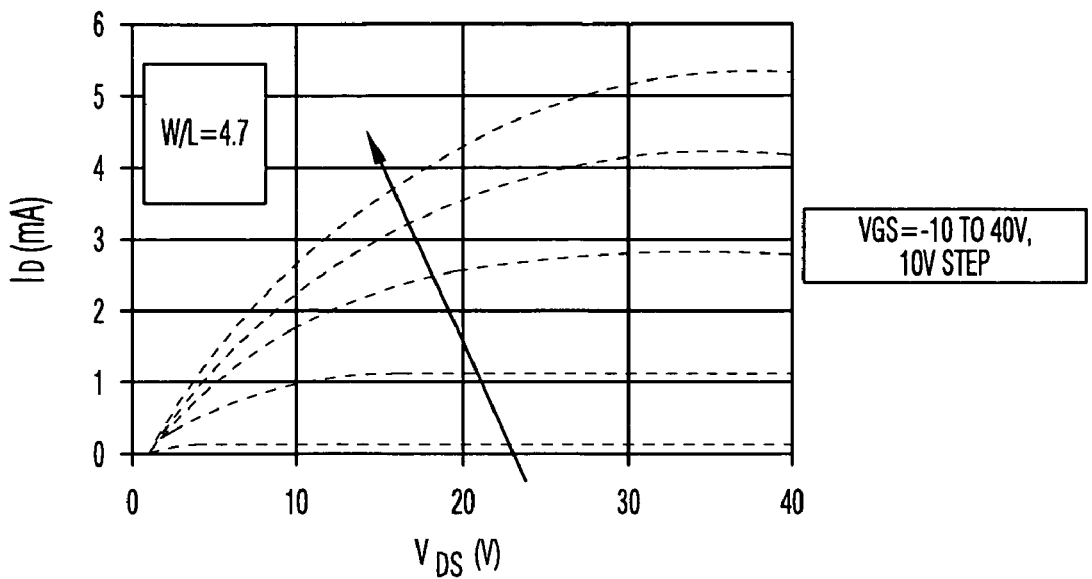
FIGS. 4A-4C illustrate electrical properties of the embodiment of the thin-film transistor illustrated in FIG. 2A.
Figure 4B:
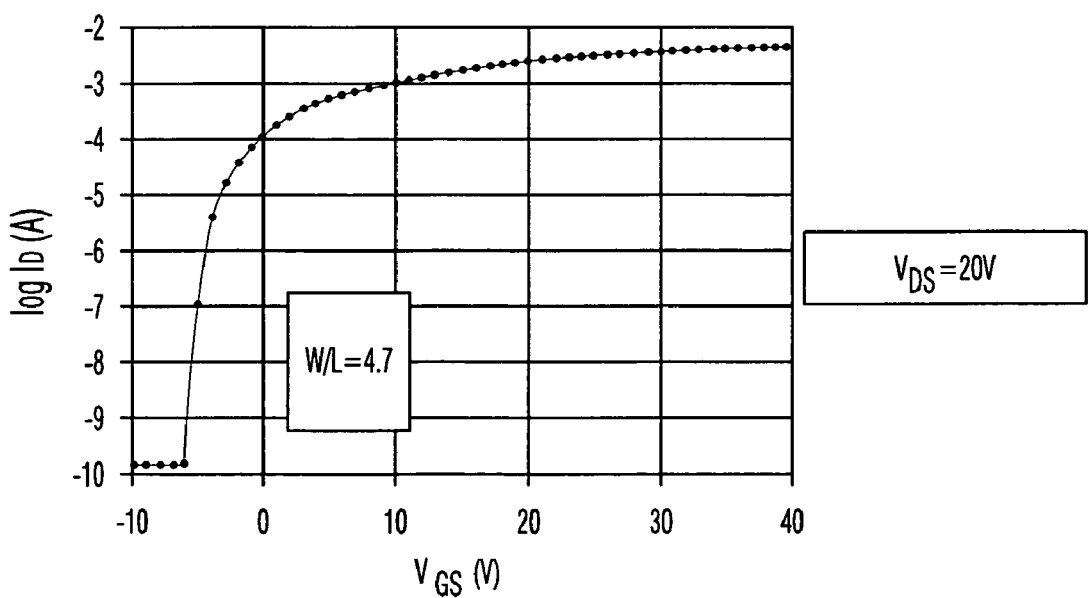
Figure 4C:
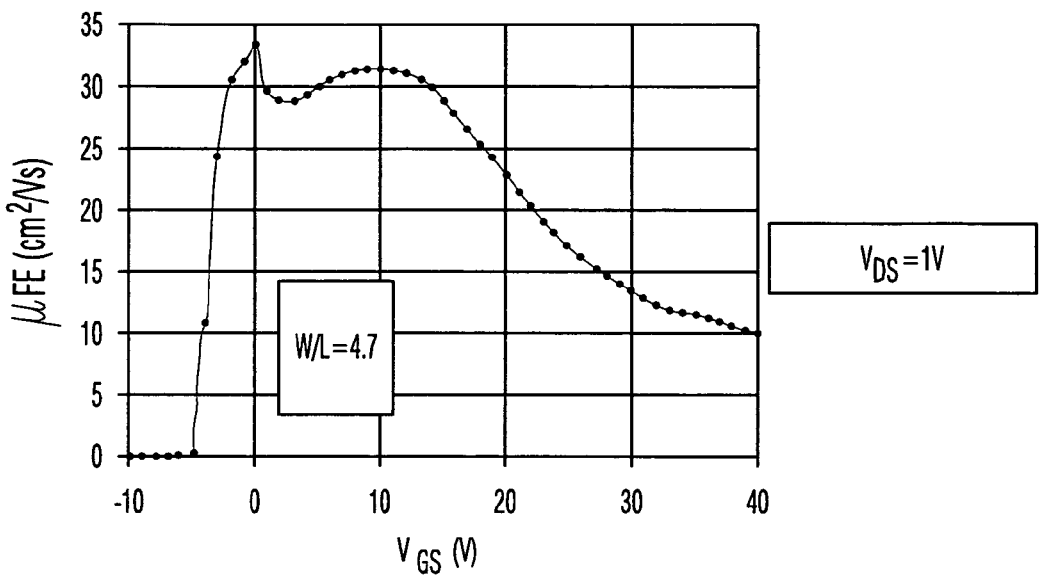

The following example, shown in FIGS. 4A-4C, illustrates the electrical characteristics of a thin-film transistor with a zinc-indium oxide channel. In this example the gate electrode is comprised of an ITO layer with an approximate thickness of 200 nm. The gate dielectric is comprised of an aluminum-titanium oxide (ATO) layer with an approximate thickness of 200 nm. The channel is comprised of a zinc-indium oxide layer with an approximate thickness of 50 nm. The source and drain electrodes are comprised of a layer of ITO having a thickness of about 200 nm.

FIG. 4A illustrates drain current vs. drain-to-source voltage ($I_D$-$V_{DS}$) characteristics of the thin-film transistor. In this embodiment, the channel width W and the channel length L were set to yield a channel width-to-length ratio of W/L=4.7. The gate-to-source voltage ($V_{GS}$) is varied from −10 to 40V in increments of 10V to generate the depicted family of $I_D$-$V_{DS}$ curves ($I_D$ increases with increasing $V_{GS}$). This device shows qualitatively ideal transistor characteristics, including drain current saturation. The drain and gate voltages employed in generating these curves are rather large compared to those typically employed for some field effect transistors (FETs). The use of a reduced voltage range would not inhibit device operation, however would reduce the maximum attainable drive current. Alternatively, drain and gate voltages can be reduced by reducing the gate insulator thickness. In this example, the gate dielectric (i.e., gate insulator) is ~200 nm thick. However, if an otherwise identical insulator is rescaled to a thickness of 20 nm, the gate and drain voltages used to attain a similar drain current may be reduced by a factor of approximately 10.

FIG. 4B illustrates the log($I_D$)-$V_{GS}$ transfer characteristics of the thin-film transistor at a fixed drain-to-source voltage ($V_{DS}$=20V). From this data curve, the drain current on-to-off ratio, a metric in quantifying TFT performance, is seen to be greater than $10^7$. The transistor turn-on voltage is also evident at $V_{GS}$=−6V.

FIG. 4C illustrates the field effect mobility of the thin-film transistor, extracted from measurement of $I_D$ VS. $V_{GS}$, at low (fixed) $V_{DS}$. The thin-film transistor with zinc-indium oxide channel shows a maximum field effect mobility of ~30 cm²/Vs. The channel mobility decreases as the gate-source voltage increases, and is reduced to a value of ~10 cm²/V s at $V_{GS}$=40V.

Figure 5:
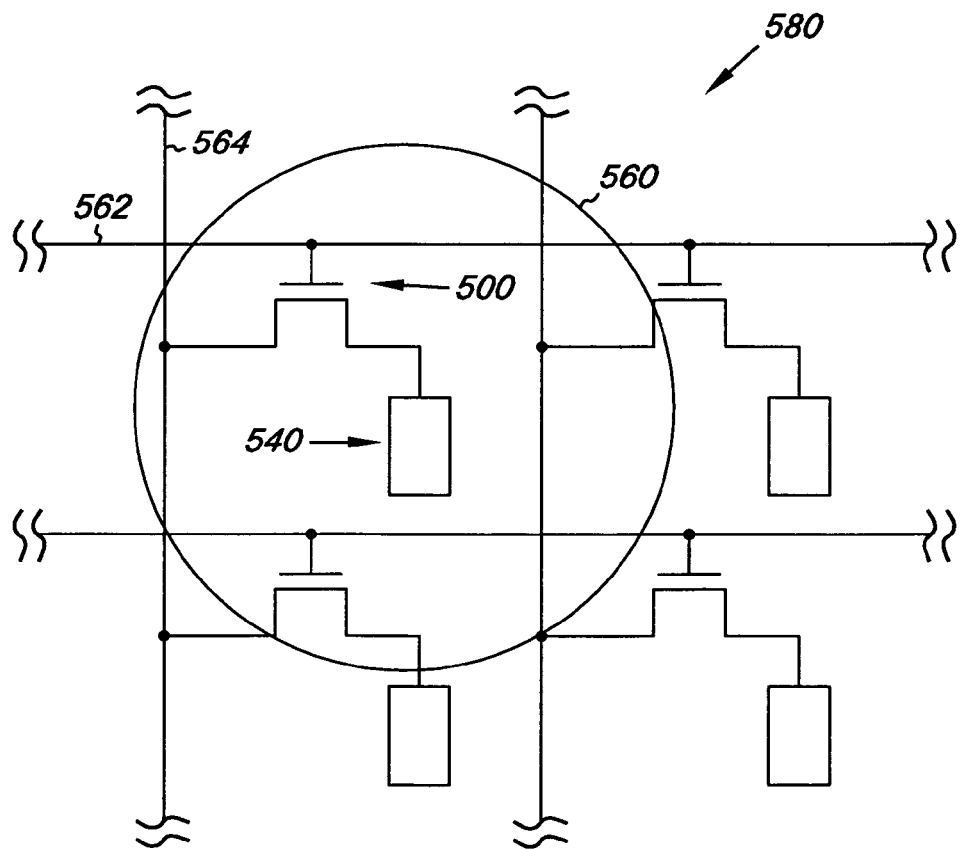
FIG. 5 illustrates an embodiment of an active matrix display area.

The embodiments described herein may be used for fabricating chips, integrated circuits, monolithic devices, semiconductor devices, and microelectronic devices, such as display devices. For example, FIG. 5 illustrates an embodiment of a display device such as an active-matrix liquid-crystal display (AMLCD) 580. In FIG. 5, the AMLCD 580 can include pixel devices (i.e., liquid crystal elements) 540 in a matrix of a display area 560. The pixel devices 540 in the matrix can be coupled to thin-film transistors 500 also located in the display area 560. The thin-film transistor 500 can include embodiments of the thin-film transistors as disclosed herein. Additionally, the AMLCD 580 can include orthogonal control lines 562 and 564 for supplying an addressable signal voltage to the thin-film transistors 500 to influence the thin-film transistors to turn on and off and control the pixel devices 540, e.g., to provide an image on the AMLCD 580.

Although specific exemplary embodiments have been illustrated and described herein, those of ordinary skill in the art will appreciate that an arrangement calculated to achieve the same techniques can be substituted for the specific exemplary embodiments shown. This disclosure is intended to cover adaptations or variations of the embodiments of the invention. It is to be understood that the above description has been made in an illustrative fashion, and not a restrictive one.

Combination of the above exemplary embodiments, and other embodiments not specifically described herein will be apparent to those of skill in the art upon reviewing the above description. The scope of the various embodiments of the invention includes other applications in which the above structures and methods are used. Therefore, the scope of various embodiments of the invention should be determined with reference to the appended claims, along with the full range of equivalents to which such claims are entitled.

In the foregoing Detailed Description, various features are grouped together in a single exemplary embodiment for the purpose of streamlining the disclosure. This method of disclosure is not to be interpreted as reflecting an intention that the embodiments of the invention necessitate more features than are expressly recited in each claim. Rather, as the following claims reflect, inventive subject matter lies in less than all features of a single disclosed exemplary embodiment. Thus, the following claims are hereby incorporated into the Detailed Description, with each claim standing on its own as a separate embodiment.

What is claimed:

1. A semiconductor device comprising:
a drain electrode;
a source electrode;
a channel contacting the drain electrode and the source electrode, wherein the channel includes zinc-indium oxide in the form of $Zn_xIn_{2y}O_{x+3y}$;
a gate electrode; and
a gate dielectric positioned between the gate electrode and the channel.

2. The semiconductor device of claim 1, wherein the zinc-indium oxide includes a single-phase crystalline state of $Zn_xIn_{2y}O_{x+3y}$, wherein values for x and y are each independently in the range of about 1 to about 15.

3. The semiconductor device of claim 1, wherein values for either x and y each include a plurality of values, wherein the zinc-indium oxide has a mixed-phase crystalline state.

4. The semiconductor device of claim 1, wherein the zinc-indium oxide in the form of $Zn_xIn_{2y}O_{x+3y}$ has an amorphous form.

5. The semiconductor device of claim 1, wherein the channel includes being positioned between and electrically coupling the drain electrode and the source electrode.

6. The semiconductor device of claim 1, wherein at least one of the drain electrode, the source electrode, the channel, the gate electrode, and the gate dielectric is substantially transparent.

7. A semiconductor device comprising:
a drain electrode;
a source electrode;
a channel contacting the drain electrode and the source electrode, wherein the channel includes zinc-indium oxide formed using any of ZnO, $Zn_xIn_{2y}O_{x+3y}$, $In_2O_3$, and mixtures thereof;
a gate electrode; and
a gate dielectric positioned between the gate electrode and the channel.

8. The semiconductor device of claim 7, wherein the channel includes zinc-indium oxide having a mixed-phase crystalline state formed from compounds selected from the group consisting of ZnO, $Zn_xIn_{2y}O_{x+3y}$, $In_2O_3$, and mixtures thereof.

9. The semiconductor device of claim 7, wherein the channel includes zinc-indium oxide having an amorphous form from compounds selected from the group consisting of ZnO, $Zn_xIn_{2y}O_{x+3y}$, $In_2O_3$, and mixtures thereof.

10. The semiconductor device of claim 7, wherein zinc-indium oxide includes $ZnO:Zn_xIn_{2y}O_{x+3y}:In_2O_3$ in a ratio of A:B:C, wherein A, B, and C are each in a range of about 0.025 to about 0.95.

11. The semiconductor device of claim 7, wherein zinc-indium oxide includes an atomic composition of zinc and indium in a ratio of zinc(x):indium(1-x), wherein x is in the range of about 0.05 to about 0.95.

12. A display device, comprising:
a plurality of pixel devices configured to operate collectively to display images, where each of the pixel devices includes a semiconductor device configured to control light emitted by the pixel device, the semiconductor device including:
a drain electrode;
a source electrode;
a channel contacting the drain electrode and the source electrode, wherein the channel includes zinc-indium oxide in the form of $Zn_xIn_{2y}O_{x+3y}$;
a gate electrode; and
a gate dielectric positioned between the gate electrode and the channel and configured to permit application of an electric field to the channel.

13. The display device of claim 12, wherein the zinc-indium oxide includes a single-phase crystalline state of $Zn_xIn_{2y}O_{x+3y}$, wherein values for x and y are each independently in the range of about 1 to about 15.

14. The display device of claim 12, wherein values for either x and y each include a plurality of values, wherein the zinc-indium oxide has a mixed-phase crystalline state.

15. The display device of claim 12, wherein the zinc-indium oxide in the form of $Zn_xIn_{2y}O_{x+3y}$ has an amorphous form.

16. A display device comprising:
a plurality of pixel devices configured to operate collectively to display images, where each of the pixel devices includes a semiconductor device configured to control light emitted by the pixel device, the semiconductor device including:
a drain electrode;
a source electrode;
a channel contacting the drain electrode and the source electrode, wherein the channel includes zinc-indium oxide formed using any of ZnO, $Zn_xIn_{2y}O_{x+3y}$, $In_2O_3$, and mixtures thereof;
a gate electrode; and
a gate dielectric positioned between the gate electrode and the channel and configured to permit application of an electric field to the channel.

17. The display device of claim 16, wherein the channel includes zinc-indium oxide having a mixed-phase crystalline state formed from compounds selected from the group consisting of ZnO, $Zn_xIn_{2y}O_{x+3y}$, $In_2O_3$, and mixtures thereof.

18. The display device of claim 16, wherein the channel includes zinc-indium oxide having an amorphous form from compounds selected from the group consisting of ZnO, $Zn_xIn_{2y}O_{x+3y}$, $In_2O_3$, and mixtures thereof.

19. The display device of claim 16, wherein zinc-indium oxide includes $ZnO:Zn_xIn_{2y}O_{x+3y}:In_2O_3$ in a ratio of A:B:C, wherein A, B, and C are each in a range of about 0.025 to about 0.95.

20. The display device of claim 16, wherein zinc-indium oxide includes an atomic composition of zinc and indium in a ratio of zinc(x):indium(1-x), wherein x is in the range of about 0.05 to about 0.95.

* * * * *